(12) United States Patent
Nakamura et al.

(10) Patent No.: US 10,167,549 B2
(45) Date of Patent: Jan. 1, 2019

(54) HEAT-RESISTANT COMPOSITE MATERIAL PRODUCTION METHOD AND PRODUCTION DEVICE

(71) Applicants: IHI Corporation, Koto-ku (JP); The University of Tokyo, Bunkyo-ku (JP)

(72) Inventors: Takeshi Nakamura, Tokyo (JP); Kozue Hotozuka, Tokyo (JP); Yasuyuki Fukushima, Tokyo (JP); Yukihiro Shimogaki, Tokyo (JP); Takeshi Momose, Tokyo (JP); Hidetoshi Sugiura, Tokyo (JP); Kohei Shima, Tokyo (JP); Yuichi Funato, Tokyo (JP)

(73) Assignees: IHI CORPORATION, Koto-ku (JP); THE UNIVERSITY OF TOKYO, Bunkyo-ku (JP)

( * ) Notice: Subject to any disclaimer, the term of this patent is extended or adjusted under 35 U.S.C. 154(b) by 0 days.

(21) Appl. No.: 15/194,887

(22) Filed: Jun. 28, 2016

(65) Prior Publication Data

US 2016/0305015 A1    Oct. 20, 2016

Related U.S. Application Data

(63) Continuation of application No. PCT/JP2015/054272, filed on Feb. 17, 2015.

(30) Foreign Application Priority Data

Feb. 17, 2014    (JP) .................................. 2014-027605

(51) Int. Cl.
C23C 16/04    (2006.01)
C23C 16/32    (2006.01)
(Continued)

(52) U.S. Cl.
CPC .......... *C23C 16/045* (2013.01); *C04B 35/565* (2013.01); *C04B 35/571* (2013.01);
(Continued)

(58) Field of Classification Search
CPC .................................................. C23C 16/325
See application file for complete search history.

(56) References Cited

U.S. PATENT DOCUMENTS 6,197,374 B1    3/2001    Huettinger et al.
RE42,887 E    11/2011    Mehregany et al.
(Continued)

FOREIGN PATENT DOCUMENTS

CA    2217702 A1    10/1996
CN    1411050 A    4/2003
(Continued)

OTHER PUBLICATIONS

English Translation of International Search Report dated May 19, 2015 in PCT/JP2015/054272, filed Feb. 17, 2015.
(Continued)

*Primary Examiner* — Joseph A Miller, Jr.
(74) *Attorney, Agent, or Firm* — Oblon, McClelland, Maier & Neustadt, L.L.P.

(57)    ABSTRACT

In the present embodiment, in the production of a heat-resistant composite material resulting from impregnating a ceramic fiber preform with silicon carbide, a mixed gas containing starting material gas, an additive gas, and a carrier gas is supplied to a substrate having a minute structure such as a preform stored in an electric furnace, silicon carbide is deposited to form a film by means of a chemical vapor deposition method or a chemical vapor infiltration method, and the film formation growth speed and embedding uniformity are controlled by means of the amount of additive gas added to the starting material gas, the (Continued)

starting material gas contains tetramethylsilane, and the additive gas contains a molecule containing chlorine such as methyl chloride or hydrogen chloride. The film formation growth speed and embedding uniformity of the silicon carbide are both achieved.

15 Claims, 6 Drawing Sheets

(51) Int. Cl.

| | | |
|---|---|---|
| H01L 21/02 | (2006.01) | |
| C04B 35/571 | (2006.01) | |
| C04B 35/622 | (2006.01) | |
| C04B 35/565 | (2006.01) | |
| C04B 35/573 | (2006.01) | |
| C04B 35/80 | (2006.01) | |

(52) U.S. Cl.
CPC ...... *C04B 35/573* (2013.01); *C04B 35/62222* (2013.01); *C04B 35/806* (2013.01); *C23C 16/325* (2013.01); *H01L 21/0262* (2013.01); *H01L 21/02381* (2013.01); *H01L 21/02529* (2013.01); *C04B 2235/3826* (2013.01); *C04B 2235/5244* (2013.01); *C04B 2235/614* (2013.01)

(56) References Cited

U.S. PATENT DOCUMENTS

| | | | |
|---|---|---|---|
| 2001/0048981 A1* | 12/2001 | Suzuki | C23C 16/4408 427/569 |
| 2005/0106320 A1 | 5/2005 | Mehregany et al. | |
| 2009/0130307 A1 | 5/2009 | Guette et al. | |
| 2010/0006859 A1* | 1/2010 | Chung | C30B 25/02 257/77 |
| 2011/0001143 A1 | 1/2011 | Mehregany et al. | |

FOREIGN PATENT DOCUMENTS

| | | |
|---|---|---|
| CN | 1810639 A | 8/2006 |
| CN | 1906735 A | 1/2007 |
| JP | 5-148018 | 6/1993 |
| JP | 8-321471 | 12/1996 |
| JP | 11-503493 | 3/1999 |
| JP | 2000-216075 | 8/2000 |
| JP | 2001-508388 | 6/2001 |
| JP | 3380761 | 2/2003 |
| JP | 2006-147866 | 6/2006 |
| JP | 2007-516355 A | 6/2007 |
| WO | WO 2013/172359 A1 | 11/2013 |

OTHER PUBLICATIONS

Written Opinion dated May 19, 2015 in PCT/JP2015/054272, filed Feb. 17, 2015.
Byung Jin Choi et al. "Chemical Vapour Deposition of Silicon Carbide by Pyrolysis of Methylchlorosilanes", Journal of Materials Science Letters, vol. 16, 1997, 4 pages.
R. Rodriguez-Clemente et al. "Influence of Temperature and Tetramethylsilane Partial Pressure on the β-SiC Deposition by Cold Wall Chemical Vapor Deposition", Journal of Crystal Growth, vol. 125, 1992, 10 pages.
Kwang Chul Kim et al. "Kinetic Study of 3C-SiC Growth on Si by Pyrolyzing Tetramethysilane in Low Pressure Radio Frequency-Induction Heated Chemical Vapor Deposition Reactor", Journal of Vacuum Science and Technology A, vol. 18, No. 891, 2000, 10 pages.
Extended European Search Report dated Oct. 4, 2017 in Patent Application No. 15749217.4.
Canadian Office Action dated Oct. 24, 2017 in Patent Application No. 2,937,144.
George D. Papasouliotis, et al., "Experimental study of atmospheric pressure chemical vapor deposition of silicon carbide from methyltrichlorosilane" Journal of Materials Research, vol. 14, No. 8, XP002754542, Aug. 1999, pp. 3397-3409.
Seong-Min Jeong, et al., "Thermodynamic approach to the synthesis of silicon carbide using tetramethylsilane as the precursor at high temperature" Journal of Crystal Growth, vol. 357, XP055409156, Aug. 2012, pp. 48-52.
Japanese Office Action dated Nov. 14, 2017 in Patent Application No. 2014-027605.
Combined Office Action and Search Report dated Dec. 27, 2017 in Chinese Patent Application No. 201580003858.6, 8 pages.

\* cited by examiner

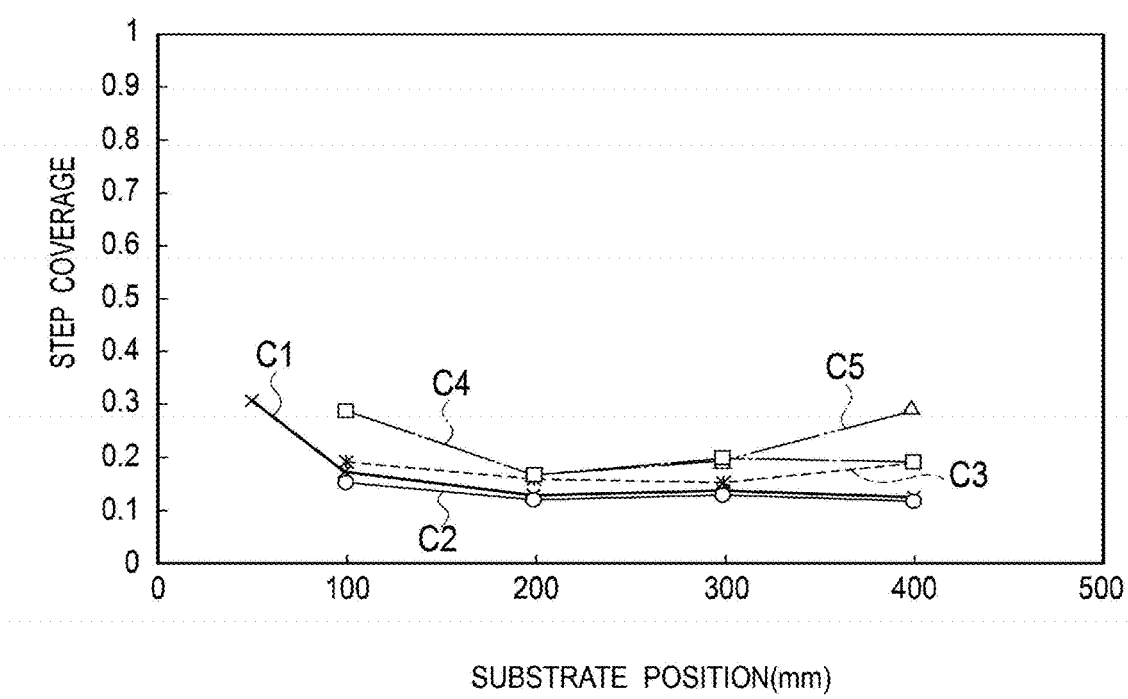

HEAT-RESISTANT COMPOSITE MATERIAL PRODUCTION METHOD AND PRODUCTION DEVICE

CROSS REFERENCE TO RELATED APPLICATIONS

This application is a continuation application of international application No. PCT/JP2015/054272 filed Feb. 17, 2015, which claims priority to Japanese Patent Application No. 2014-027605 filed Feb. 17, 2014, each of which is hereby incorporated by reference in their entity.

BACKGROUND

1. Field

The present embodiment relates to a method and a device for producing a heat-resistant composite material containing silicon carbide and, more specifically, to a technical field applied to production of thin film of ceramics and semiconductors by chemical vapor deposition (CVD), production of the heat-resistant structure material, and the process technique of CVD.

2. Description of Related Art

Components used in high-temperature places such as engines of airplanes and rockets always utilize lightweight materials excellent in mechanical strength even in high temperature. However, it is known that the characteristics of conventionally used nickel-base superalloys are reaching the limit of advancement. Accordingly, ceramic matrix composites (CMC) are attracting attention as a next-generation material that can accommodate the aforementioned needs and are being in development for practical use in the near future.

The CMCs are composite materials including ceramics which is infiltrated as a matrix in a base material (woven fabric) including ceramic fibers (a reinforcement material). SiC/SiC-CMC, which use silicon carbide (SiC) in both of the reinforcement material and matrix, particularly has smaller weight and higher heat resistance than conventional nickel-base superalloys and is regarded as the leading next-generation material.

In the process to produce SiC/SiC-CMC, the process to deposit a matrix of silicon carbide in a preform composed of silicon carbide fibers for integration of the fibers is difficult. The process to integrate fibers needs to uniformly deposit a matrix of silicon carbide (SiC) within the preform and is carried out by chemical vapor infiltration (CVI) using the reaction in the vapor phase. The conventional CVI mainly uses a gas mixture of methyltrichlorosilane (MTS, $CH_3SiCl_3$) and hydrogen ($H_2$) as a precursor for depositing silicon carbide.

PRIOR ART DOCUMENTS

Patent Documents

Patent Document 1: JP 2001508388 A
Patent Document 2: JP 3380761 B
Patent Document 3: JP 2000-216075 A

Non-Patent Documents

Non-Patent Document 1: B. J. Choi, D. W. Park, and D. R. Kim, Journal of Materials Science Letters 16 (1997) 33

Non-Patent Document 2: R. Rodriguez-Clemente, A. Figueras, S. Garelik, B. Armas and C. Combescure, J. of Cryst. Growth 125 (1992) 533

Non-Patent Document 3: K. C. Kim, K. S. Nahm, Y. B. Hahn, Y. S. Lee, and H. S. Byun, J. Vac. Sci. Technol., A 18 (2000) 891

SUMMARY

In order to increase the uniformity of deposition of the matrix of silicon carbide, it is necessary to perform film formation by diffusing the precursor in the preform at an extremely low reaction rate. To be specific, the process of chemical vapor infiltration spends a long time. The long-time film formation of chemical vapor infiltration is one of the factors that degrade mass production.

Gas mixtures containing MTS and hydrogen ($H_2$) have problems of extremely slow film formation and exhaust of combustible byproducts due to chlorine (Cl) contained in precursor molecules. In the light of mass production in the future, it is necessary to implement both uniform growth rate in the reaction device of chemical vapor infiltration and uniform deposition rate within the preform and reduce or eliminate the combustible byproducts while shortening the production time.

The present embodiment is proposed in the light of the aforementioned circumstances, and an object thereof is to provide heat-resistant composite material production method and production device which are applied to a process to produce SiC/SiC-CMC and quickly form film of silicon carbide with less byproducts.

In order to solve the aforementioned problems, a method of producing a heat-resistant composite material according to the application uses chemical vapor deposition or chemical vapor infiltration and includes the steps of: accommodating a base material in a reaction furnace; and causing precursor gas, additive gas, and carrier gas to flow in the reaction furnace to deposit silicon carbide on the base material for film formation. The precursor gas includes tetramethylsilane, and the additive gas includes molecules containing chlorine.

The additive gas may contain at least one of a group consisting of hydrogen chloride, monochloromonomethylsilane, methyldichlorosilane, methyltrichlorosilane, dimethylmonochlorosilane, dimethyldichlorosilane, trimethylmonochlorosilane, monochlorosilane, dichlorosilane, trichlorosilane, tetrachlorosilane, chlorodisilane, dichlorodisilane, hexachlorodisilane, octachlorotrisilane, monochloromethane, dichloromethane, chloroform, tetrachloromethane, monochloroacetyl ene, dichloroacetylene, monochloroethylene, dichloroethylene, trichloroethylene, tetrachloroethylene, monochloroethane, dichloroethane, trichloroethane, tetrachloroethane, pentachloroethane, hexachloroethane, monochloropropane, dichloropropane, trichloropropane, tetrachloropropane, pentachloropropane, hexachloropropane, heptachloropropane, octachloropropane, and chlorine molecules. The additive gas may contain at least one of hydrogen chloride and monochloromethane. The additive gas may contain hydrogen chloride. The mole ratio α of tetramethylsilane to hydrogen chloride satisfies $1<\alpha\leq 3$ where the number of moles of tetramethylsilane is 1.

Growth rate and filling uniformity at the film formation of silicon carbide may be controlled through an amount of the additive gas. The film formation of silicon carbide may follow a first-order reaction, and the growth rate and filling uniformity at the film formation of silicon carbide may be controlled by controlling probability of a growth species sticking to the base material through the amount of the additive gas.

The film formation of silicon carbide may follow a Langmuir-Hinshelwood rate formula, and the growth rate and filling uniformity at the film formation of silicon carbide may be controlled by adjusting the amount of the additive gas so that the film formation is performed in a zero-order reaction region of the Langmuir-Hinshelwood rate formula. The growth rate and filling uniformity at the film formation of silicon carbide may be optimized.

The distribution of growth rate at the film formation of silicon carbide in terms of the position in the reaction furnace may be controlled through the amount of the additive gas. The distribution of growth rate may be optimized to be uniform. The precursor gas may be supplied through a plurality of positions located across the reaction furnace from the upstream end to the downstream end.

The precursor gas may contain at least any one of methyltrichlorosilane and dimethyldichlorosilane. The carrier gas may contain at least one of hydrogen, nitrogen, helium, and argon. The additive gas may include an etching operation. The base material may include at least any one of a fiber preform, a substrate provided with a trench, and a porous substrate. The reaction furnace may be a hot-wall furnace.

A heat-resistant composite material producing device according to the application uses the aforementioned method of producing a heat-resistant composite material and includes: a reaction furnace accommodating a base material; a precursor gas supply source supplying precursor gas to the reaction furnace; a carrier gas supply source supplying carrier gas to the reaction furnace; an additive gas supply source supplying additive gas to the reaction furnace; and a controller controlling the supply of the additive gas. The precursor gas supply source supplies the precursor gas including tetramethylsilane, and the additive gas supply source supplies the additive gas including molecules containing chlorine.

According to the present embodiment, it is possible to quickly form film of silicon carbide in the process to produce SiC/SiC-CMC and reduce generation of byproducts, thus increasing the mass production.

BRIEF DESCRIPTION OF DRAWINGS

FIG. 5 is a graph illustrating the relationship between the substrate position and step coverage.

DETAILED DESCRIPTION OF EMBODIMENTS

Hereinafter, a description is given of a method and a device for producing a heat-resistant composite material in detail with reference to the drawings.

[Configuration of Production Device]

Figure 1:
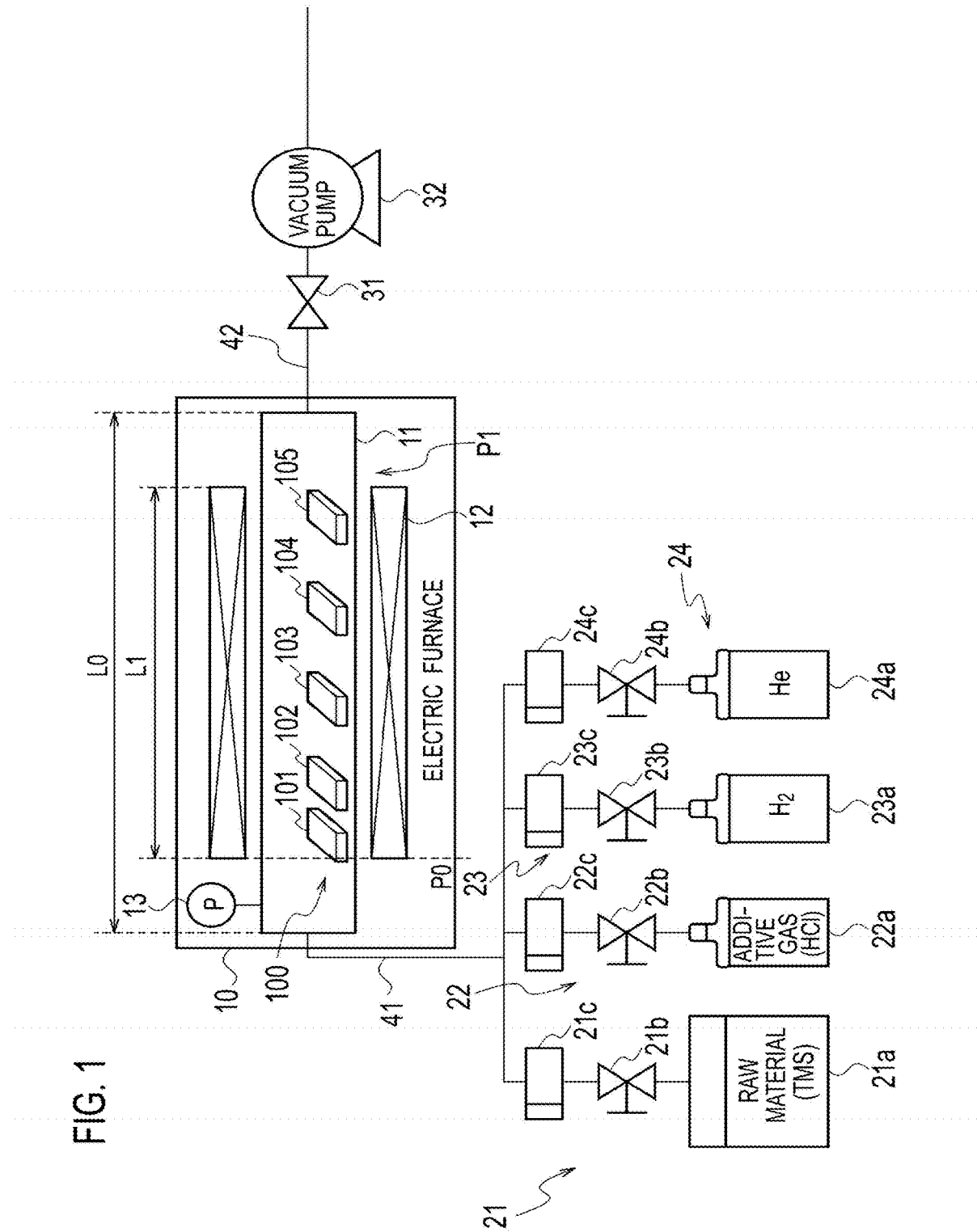
FIG. 1 is a diagram illustrating a schematic configuration of a device of producing a heat-resistant composite material.

FIG. 1 is a diagram illustrating a schematic configuration of the device for producing a heat-resistant composite material. This production device constitutes a chemical vapor deposition (CVD) device or a chemical vapor infiltration (CVD device and includes a horizontal hot-wall electric furnace 10 as a reaction furnace. The electric furnace 10 is maintained at a predetermined temperature and a predetermined pressure and is supplied with a gas mixture including tetramethylsilane (TMS, $(CH_3)_4Si$) as a precursor gas, hydrogen chloride (HCl) as an additive gas, and hydrogen ($H_2$) and helium (He) as a carrier gas.

A first flow channel 41, which supplies the gas mixture from the upstream side to the electric furnace 10, is supplied with TMS as the precursor gas from a precursor gas supply portion 21 at a predetermined flow rate. The precursor gas is supplied by gasifying the precursor stored in a precursor gas supply source 21a in the form of liquid. The precursor gas supply portion 21 regulates the flow rate of the supplied precursor gas through a first valve 21b and controls the precursor gas to a predetermined mass flow through a first mass flow controller 21c. The first valve 21b and first mass flow controller 21c constitute a precursor gas flow rate control portion as a precursor gas supply controller to control the supply of the precursor gas.

The first flow channel 41 is supplied with hydrogen chloride as an additive gas from an additive gas supply portion 22 at a predetermined flow rate. The additive gas supply portion 22 regulates through a second valve 22b, the flow rate of the additive gas supplied from an additive gas supply source 22a and controls the additive gas to a predetermined mass flow through a second mass flow controller 22c. The second valve 22b and second mass flow controller 22c constitute an additive gas flow rate control portion as an additive gas supply controller to control the supply of the additive gas.

Moreover, the first flow channel 41 is supplied with hydrogen as a first carrier gas from a first carrier gas supply portion 23 at a predetermined flow rate. The first carrier gas supply portion 23 regulates through a third valve 23b, the flow rate of the first carrier gas supplied from a first carrier gas supply source 23a and controls the first carrier gas to a predetermined mass flow through a third mass flow controller 23c.

Furthermore, the first flow channel 41 is supplied with helium as a second carrier gas from a second carrier gas supply portion 24 at a predetermined flow rate. The second carrier gas supply portion 24 regulates through a fourth valve 24b, the flow rate of the second carrier gas supplied from a second carrier gas supply source 24a and controls the second carrier gas to a predetermined mass flow through a fourth mass flow controller 24c.

The third valve 23b and third mass flow controller 23c of the first carrier gas supply portion 23 and the fourth valve 24b and fourth mass flow controller 24c of the second carrier gas supply portion 24 constitute a carrier gas flow rate control portion as a carrier gas supply controller which controls the flow rates of the first and second carrier gases to control the supply of the carrier gas.

The electric furnace 10 includes a transparent reaction tube 11 like a quartz tube and a heater 12 surrounding the reaction tube 11 and constitutes a hot-wall furnace in which an object accommodated in the reaction tube 11 is heated from the wall surface by the heater 12. To one of the openings of the reaction tube 11 on the upstream side, a gas mixture of the precursor gas, additive gas, and carrier gas is supplied from the first flow channel 41. The gas mixture flows toward the other opening on the downstream side in the reaction tube 11.

The electric furnace 10 accommodates plural base materials 100, which are arranged side by side from upstream to downstream in the reaction tube 11. The base materials 100 are supplied with the gas mixture at a predetermined temperature and a predetermined pressure. The base materials 100 include microstructures, and silicon carbide (SiC) is deposited on the microstructures thereof to form film.

From the opening of the reaction tube 11 on the downstream side in the electric furnace 10, exhaust gas containing the gas mixture not contributing to the film formation of silicon carbide and byproducts related to the film formation of silicon carbide is discharged to a second flow channel 42. Some of the byproducts remain and are deposited in the reaction tube 11 in some cases. The second flow channel 42 is provided with a pressure control valve 31 and a vacuum pump 32 and maintains the predetermined pressure in the reaction tube 11 of the electric furnace 10.

In this embodiment, length L0 of the reaction tube 11 of the electric furnace 10 in the longitudinal direction that the gas mixture flows is 900 mm, and longitudinal length L1 of the heater 12 surrounding the reaction tube 11 is 500 mm. The position of each base material 100 placed in the reaction tube 11 is indicated by a distance along the longitudinal direction from a referential position P0, which is at an upstream end of the heater 12 in the direction that the gas mixture flows.

This production device includes a not-illustrated control device as a controller. The control device controls the aforementioned precursor gas flow rate control portion, carrier gas flow rate control portion, and additive gas flow rate control portion to regulate the flow rates of the precursor gas, additive gas, and carrier gas supplied through the first flow channel 41 to the electric furnace 10.

To be specific, the flow rate of the precursor gas is controlled with the precursor gas flow rate control portion including the first valve 21*b* and first mass flow controller. The flow rate of the additive gas is controlled with the additive gas flow rate control portion including the second valve 22*h* and second mass flow controller 22*c*. The flow rate of the carrier gas is controlled with the carrier gas flow rate control portion including the third and fourth valves 23*b* and 24*b* and third and fourth mass flow controllers 23*c* and 24*c*.

The control device detects the pressure within the reaction tube 11 with a pressure gauge 13 provided for the electric furnace 10 and controls the pressure control valve 31 so as to maintain the predetermined pressure within the reaction tube 11. The control device detects the temperature within the electric furnace 10 through a not-shown thermocouple provided for the electric furnace 10 and controls the heater 12 to maintain the predetermined temperature within the electric furnace 10.

In this embodiment, the control device is capable of controlling deposition of silicon carbide on the microstructures of the base materials 100 accommodated in the electric furnace 10 by controlling the flow rates of the precursor gas, additive gas, and carrier gas contained in the gas mixture supplied to the electric furnace 10. For example, the control device is capable of adjusting the flow rates of the precursor gas, carrier gas, and additive gas and the ratio of the flow rates thereof and adjusting the amount of additive gas to the precursor.

[Growth Rate and Filling Uniformity]

The control device performs the above-described control so as to implement both high growth rate of film deposited on the microstructures of the base materials 100 and good filling uniformity. In other words, the control device implements a predetermined growth rate to ensure the mass-productivity of heat-resistant composite products composed of the base material 100 impregnated with silicon carbide and implements predetermined filling uniformity to guarantee the filling of the microstructures of the base material 100 with silicon carbide.

Herein, the deposition of silicon carbide on the microstructures of the base material 100 follows a first-order reaction mechanism or a reaction mechanism based on the Langmuir-Hinshelwood rate formula depending on the growth species which is to be formed into film. The control method thereof varies depending on the reaction mechanisms, and the reaction mechanisms are individually described below.

[Case of First-Order Reaction Mechanism]

When growth species of silicon carbide follow a first-order reaction mechanism, the growth rate at film formation of silicon carbide is in a first-order relation with the concentration of the growth species. In this case, the control portion makes a control to generate a large amount of growth species having low sticking probability. The growth species having low sticking probability uniformly stick to the microstructures of the base material, ensuring the filling uniformity at film formation. Moreover, generation of a large amount of growth species ensures the growth rate at film formation. Accordingly, it is possible to implement both high growth rate and good filling uniformity. As the sticking probability is reduced, the filling uniformity is increased, but the growth rate is lowered. The control device is therefore designed to implement both of desired filling uniformity and desired growth rate.

In order to generate growth species having low sticking probability, the control device controls the precursor gas, carrier gas, and additive gas flow rate control portions so that the flow rates of the precursor gas, carrier gas, and additive gas are in a predetermined ratio. In other words, the control device makes a control to add only a predetermined amount of the additive gas with respect to the precursor gas. Moreover, in order to generate a large amount of growth species, the control device controls the precursor gas, carrier gas, and additive gas flow rate control portions to adjust the flow rates of the precursor gas, carrier gas, and additive gas to predetermined flow rates. Furthermore, the control device optimizes the growth rate and filling uniformity by controlling parameters, including the ratio and flow rates of the precursor gas, carrier gas, and additive gas.

[Case of Reaction Mechanism Based on Langmuir-Hinshelwood Rate Formula]

In the case where the growth species of silicon carbide follow the reaction mechanism based on the Langmuir-Hinshelwood rate formula, as the concentration of the growth species increases, the growth rate at film formation is saturated with respect to the concentration, and there is a zero-order reaction area where the growth rate does not depend on the concentration of growth species. The control portion makes a control to increase the concentration of growth species to a high concentration not less than a predetermined value so that the concentration of the growth species falls in the zero-order reaction area. In the zero-order reaction area of the growth species, the growth rate at film formation is constant independently of the concentration, and the filling uniformity at film formation can be ensured.

Moreover, by increasing the concentration, the growth rate is increased. It is therefore possible to implement both high growth rate and good filling uniformity.

The control device controls the precursor gas, additive gas, and carrier gas flow rate control portions so that the flow rates of the precursor gas, carrier gas, and additive gas are in a predetermined ratio. In other words, the control device makes a control to add only a predetermined amount of additive gas with respect to the precursor gas. Moreover, in order for the concentration of growth species to fall in the zero-order region, the control device controls the precursor gas, additive gas, and carrier gas flow rate control portions to adjust the flow rates of the precursor gas, additive gas, and carrier gas to predetermined flow rates. Furthermore, the control portion optimizes the growth rate and filling uniformity by controlling the parameters, including the ratio and flow rates of the precursor gas, additive gas, and carrier gas.

[Effect of Additive Gas]

Irrespectively of which reaction mechanism the growth species follow, the additive gas containing chlorine generates molecules to be adsorbed on the reaction surface of silicon carbide and prevents growth species from being adsorbed on the reaction surface, thus reducing the sticking probability of the growth species. The additive gas containing chlorine therefore ensures good filling uniformity at film formation.

[Distribution of Growth Rate in Furnace]

On the other hand, in some cases of producing a heat-resistant composite material in an industrial scale, the electrical furnace 10, which is as long as about several meters, for example, is provided and accommodates the plural base materials 100 which are arranged side by side in the direction from upstream to downstream in the reaction tube 11 for simultaneous film formation of silicon carbide on the base materials 100.

In the aforementioned case, the control device makes a control to reduce the growth rate in the upstream side of the reaction tube 11 so that the growth rate is uniform across the plural base materials 100. For example, the control device controls the precursor gas, additive gas, and carrier gas flow rate control portions as well as controls the heater 12 to regulate the flow rate of the gas mixture and the distribution of temperature so that the growth species have low concentration upstream and have high concentration downstream.

The control device makes a control so that the precursor gas is sufficiently supplied downstream. For example, the control device can control the precursor gas, carrier gas, and additive gas flow rate control portions so that the gas mixture is supplied at a sufficient flow rate. Moreover, the gas mixture can be supplied not only from one end in the upstream side of the reaction tube 11 but also simultaneously from another supply channel provided between the end in the upstream side and the other end in the downstream side of the reaction tube 11.

Moreover, the control device makes a control to equalize the growth rate across the upstream and downstream ends and increase the use efficiency of the precursor gas in the supplied gas mixture. For example, the control device can increase the use efficiency of the precursor gas by properly adjusting the parameters, including: the ratio, the flow rates, and the ways of supplying the precursor gas, additive gas, and carrier gas to the electric furnace 10; and distributions of temperature and pressure in the electric furnace 10. This can improve the distribution of growth rate in the electric furnace 10 and reduce the production cost. Moreover, by using the aforementioned parameters, the control portion can optimize the use efficiency of the precursor gas.

[Operational Effect of Gas Mixture Containing TMS and Hydrogen Chloride]

The gas mixture of the embodiment contains TMS as the precursor gas and hydrogen chloride as the additive gas. The operational effects of the thus configured gas mixture are described below. First, a description is given of the mechanism and problems of the technique to form film of silicon carbide by using a gas mixture of methyltrichlorosilane (MTS, $CH_3SiCl_3$) which exists as a prior art for comparison with the embodiment.

One molecule of MTS includes one silicon (Si) atom, one carbon (C) atom, three hydrogen (H) atoms, and three chlorine (Cl) atoms in the precursor. The gas mixture of MTS and hydrogen ($H_2$) is decomposed mainly in the gas phase when heated at a high temperature of about 1000° C. and generates many types of intermediates composed of various combinations of Si, C, H, and Cl. The types of major intermediates generated number several tens or more. It is considered that these intermediates and MTS reach the surfaces of silicon carbide fibers and react with the same to form film of silicon carbide. As a part of the intermediates, chlorine molecules and hydrogen chloride (HCl) molecules are generated. By the existing studies, chlorine and hydrogen chloride are known to have an effect of inhibiting film formation of silicon carbide (film formation inhibiting effect) and directly lead to reduction of the rate of film formation of silicon carbide.

On the other hand, it is known that among Si—C—H—Cl based gases, a large amount of SiClx gasses are generated in the gas phase at high temperature. By the existing studies, it is known that SiClx polymerizes into combustible byproducts (oily silane) as the temperature lowers. Oily silane mainly composed of silicon and chlorine exothermically reacts with water ($H_2O$) in the air and changes into molecules of silica ($SiO_2$), hydrogen chloride, and the like. Since the molecular structure of MTS includes three chlorine (Cl) atoms, use of MTS inevitably comes with reducing the growth rate due to the film formation inhibiting effect and generating combustible byproducts. The film formation inhibiting effect of chlorine or hydrogen chloride also includes a merit that improves the infiltration properties.

In contrast, a molecule of TMS, which is used as the precursor gas in the embodiment, includes one silicon (Si) atom, four carbon atoms, and 12 hydrogen atoms in the precursor. TMS, which does not include chlorine in the precursor, has a merit that does not cause the film formation inhibiting effect and generation of oily silane unlike MTS.

Since TMS includes carbon more than silicon, the composition of silicon to carbon is less likely to have a stoichiometric ratio of 1 to 1, and use of TMS has a tendency of forming silicon carbide film containing excess carbon. TMS, which is highly reactive, generates a large amount of soot in the gas phase and sometimes seriously damages the vacuum pump, a detoxification device, and the like situated downstream. Moreover, TMS, which is highly reactive, has reduced infiltration properties in some cases. In this embodiment, therefore, gas containing chlorine like hydrogen chloride is added at a freely adjustable concentration to cancel the demerit of MTS. The embodiment reduces the demerits of TMS (the improper composition of silicon carbide, large amount of soot, and poor infiltration) while implementing high-speed film formation and reducing combustible byproducts.

The control device used in the embodiment can be easily implemented by a commercially-available microcontroller caused to execute predetermined instructions. Alternatively, the control device can be implemented by a general-purpose personal computer caused to execute a predetermined program.

In this embodiment, the precursor gas is TMS by way of example. The precursor gas may further include methyltrichlorosilane (MTS, $CH_3SiCl_3$), dimethyldichlorosilane ($C_2H_6Cl_2Si$, DDS), trimethylchlorosilane ($C_3H_9SiCl$), silicon tetrachloride ($SiCl_4$), silane ($SiH_4$), propane ($C_3H_8$), and the like.

The additive gas is hydrogen chloride by way of example in the aforementioned embodiment but can be methyl chloride (monochloromethane $CH_3Cl$). The additive gas can be gas including molecules containing chlorine as follows: monochloromonomethylsilane ($CH_3SiH_2Cl$), methyldichlorosilane ($CH_3SiHCl_2$), methyltrichlorosilane (MTS, $CH_3SiCl_3$), dimethylmonochlorosilane ($(CH_3)_2SiHCl$), dimethyldichlorosilane (DDS, $(CH_3)_2SiCl_2$)), trimethylmonochlorosilane ($(CH_3)_3SiCl$), monochlorosilane ($SiH_3Cl$), dichlorosilane ($SiH_2Cl_2$), trichlorosilane ($SiHCl_3$), tetrachlorosilane ($SiCl_4$), chlorodisilane ($Si_2H_5Cl$), dichlorodisilane ($Si_2H_4Cl_2$), hexachlorodisilane ($Si_2Cl_6$), octachlorotrisilane ($Si_3Cl_8$), monochloromethane ($CH_3Cl$), dichloromethane ($CH_2Cl_2$), chloroform ($CHCl_3$), tetrachloromethane ($CCl_4$), monochloroacetylene ($C_2HCl$), dichloroacetylene ($C_2Cl_2$), monochloroethylene ($C_2H_3Cl$), dichloroethylene ($C_2H_2Cl_2$), trichloroethylene ($C_2HCl_3$), tetrachloroethylene ($C_2Cl_4$), monochloroethane ($C_2H_5Cl$), dichloroethane ($C_2H_4Cl_2$), trichloroethane ($C_2H_3Cl_3$), tetrachloroethane ($C_2H_2Cl_4$), pentachloroethane ($C_2HCl_5$), hexachloroethane ($C_2Cl_6$), monochloropropane ($C_3H_7Cl$), dichloropropane ($C_3H_6Cl_2$), trichloropropane ($C_3H_5Cl_3$), tetrachloropropane ($C_3H_4Cl_4$), pentachloropropane ($C_3H_3Cl_5$), hexachloropropane ($C_3H_2Cl_6$), heptachloropropane ($C_3H_1Cl_7$), octachloropropane ($C_3Cl_8$), and chlorine molecules ($Cl_2$).

The aforementioned molecules containing chlorine provide chlorine-contained molecules that are adsorbed on the surfaces of microstructures of the base material 100. The chlorine-contained molecules that are adsorbed on the surfaces of microstructures reduce the probability at which the growth species stick to the microstructures, thereby ensuring the filling uniformity at film formation.

The carrier gas is not limited to hydrogen ($H_2$) and helium (He) and may also include nitrogen ($N_2$) or noble gas such as helium (He) or argon (Ar).

The base material having microstructures on which silicon carbide is deposited to form film can be composed of a preform of ceramic fibers, a preform of carbon fibers, a substrate having a surface provided with trenches, or porous ceramics.

EXAMPLE

In an example to which the aforementioned embodiment is applied, Si (100) substrates with trenches formed in the surfaces are prepared as the base materials 100 including microstructures and placed as first to fifth substrates 101 to 105 in the reactive tube 11 of the electric furnace 10 of the production device. The first to fifth substrates 101 to 105 are placed at positions of 50, 100, 200, 300, and 400 mm downward from the referential position P0 at an end of the heater 12, respectively.

The first to fifth substrates 101 to 105 are subjected to chemical vapor deposition (CVD) or chemical vapor infiltration, and silicon carbide is deposited to form film on the first to fifth substrates 101 to 105. As the growth conditions, the environment within the reaction tube 11 is maintained at a constant temperature of 900° C. and a constant pressure of 100 Torr. The gas mixture supplied to the reaction tube 11 includes MTS as the precursor gas, hydrogen chloride (HCl) as the additive gas, and hydrogen ($H_2$) and helium (He) as the carrier gas.

As illustrated in Table 1 below, Experiments No. 1 to 7 are executed. In Experiments No. 1 to 6, the amount of added hydrogen chloride is gradually increased. The partial pressure of helium in the carrier gas is controlled depending on the variations in the partial pressure of hydrogen chloride so that the total pressure of the gas mixture is maintained. In Experiment No. 7, the precursor gas is MTS instead of TMS as a comparative example. The other conditions are the same as those of Experiment No. 1.

TABLE 1

| NO. | TEMPERATURE ° C. | TOTAL PRESSURE Torr | TOTAL FLOW RATE sccm | PARTIAL PRESSURE (TORR) | | | | |
|---|---|---|---|---|---|---|---|---|
| | | | | MTS | TMS | $H_2$ | He | HCl |
| 1 | 900 | 20 | 100 | 0 0 | 1 6 | 4 0 | 14 4 | 0 0 |
| 2 | 900 | 20 | 100 | 0 0 | 1 6 | 4 0 | 14 0 | 0 4 |
| 3 | 900 | 20 | 100 | 0 0 | 1 6 | 4 0 | 14 0 | 0 8 |
| 4 | 900 | 20 | 100 | 0 0 | 1 6 | 4 0 | 12 8 | 1 6 |
| 5 | 900 | 20 | 100 | 0 0 | 1 6 | 4 0 | 11 2 | 3 2 |
| 6 | 900 | 20 | 100 | 0 0 | 1 6 | 4 0 | 9 6 | 4 8 |
| 7 | 900 | 20 | 100 | 1 6 | 0 0 | 4 0 | 14 4 | 0 0 |

Figure 2:
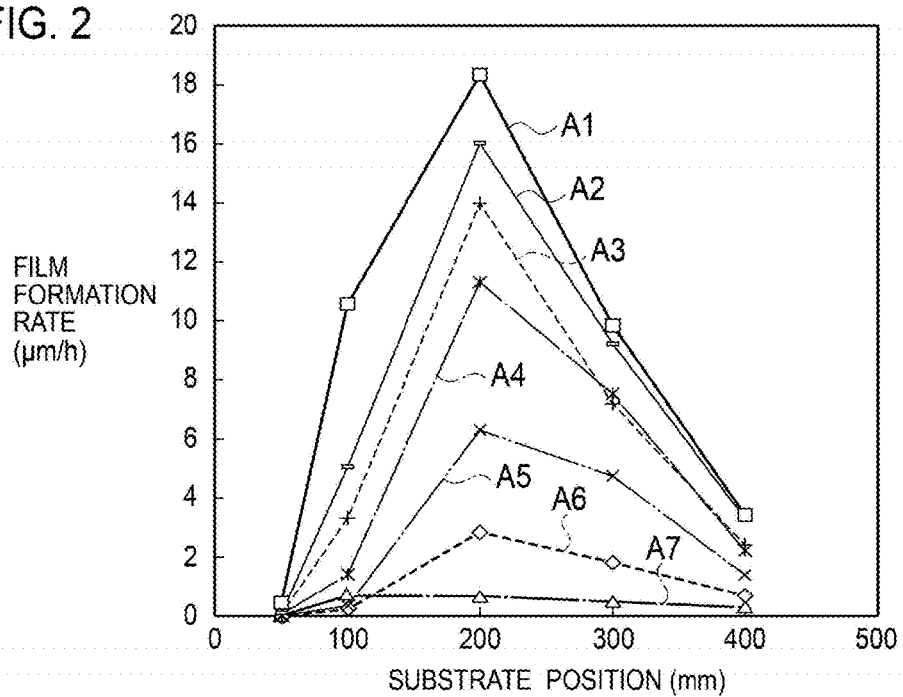
FIG. 2 is a graph illustrating the relationship between the substrate position and growth rate.

FIG. 2 is a graph illustrating the relationship between the substrate position and the growth rate. The substrate position on the horizontal axis in FIG. 2 indicates the positions of the first to fifth substrates 101 to 105. The vertical axis in FIG. 2 plots the growth rate. Polygonal lines A1 to A7 in FIG. 2 illustrate the results of Experiments No. 1 to 7, respectively.

Figure 3:
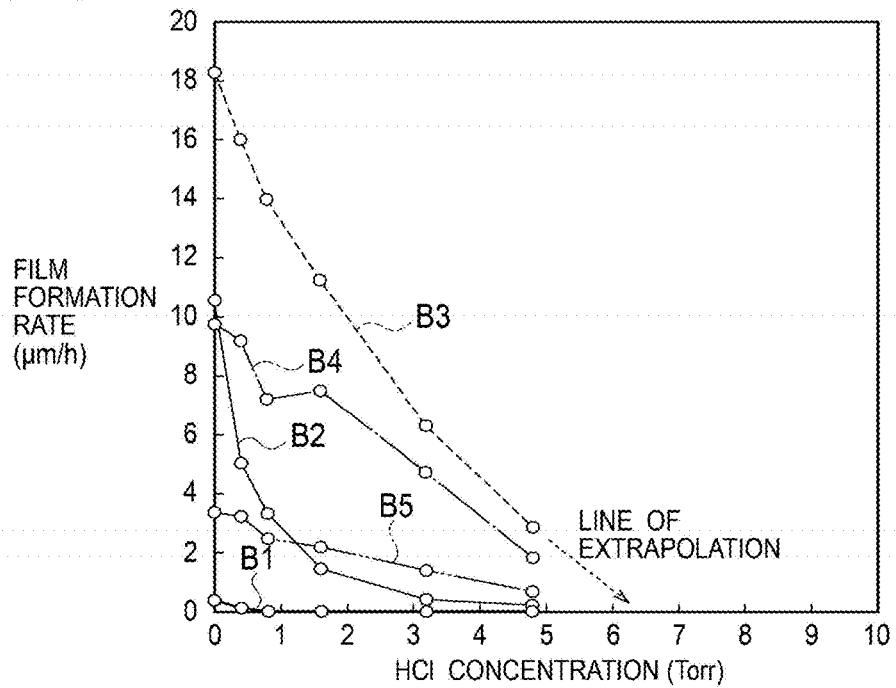
FIG. 3 is a graph illustrating the relationship between the concentration of added hydrogen chloride and growth rate.

FIG. 3 is a graph illustrating the relationship between the concentration of added hydrogen chloride and growth rate. The horizontal axis in FIG. 3 plots the concentration of added hydrogen chloride. The vertical axis in FIG. 3 plots the growth rate. Polygonal lines B1 to B5 in FIG. 3 illustrate the results for the first to fifth substrates 101 to 105, respectively. The polygonal line B3 is extrapolated on the higher concentration side. FIG. 3 illustrates data of the results of the same experiments as those illustrated in FIG. 2.

In terms of Experiments No. 1 to 6 in which hydrogen chloride is added to TMS, FIGS. 2 and 3 show the tendency of the growth rate gradually lowering as the concentration of added hydrogen chloride increases. The growth rate takes the maximum value at the third substrate 103, the substrate position of which is 200 mm. Experiment No. 7 as the comparative example using MTS instead of TMS (the results thereof are illustrated by the polygonal line A7 of FIG. 2) indicates the tendency of the growth rate further lowering.

As illustrated by the polygonal line A6 in FIG. 2, when the concentration of hydrogen chloride added to TMS is excessively high, the growth rate is lowered to the level comparable to that of the comparative example using only MTS. In order to set the growth rate to a desired range, hydrogen chloride needs to be added at a proper concentration. Specifically, it is desirable that the ratio α of TMS to HCl is $0 \leq \alpha \leq 4$.

FIGS. 4A to 4D are graphs illustrating the relationship between the substrate position and film composition. FIGS. 4A to 4D represent the results of Experiments No. 1, 2, 4, and 6, respectively. The horizontal axis in each drawing plots the positions of the first to fifth substrates 101 to 105. The vertical axis in each drawing plots the composition of carbon (C), silicon (Si), and oxygen (O).

Figure 4A:
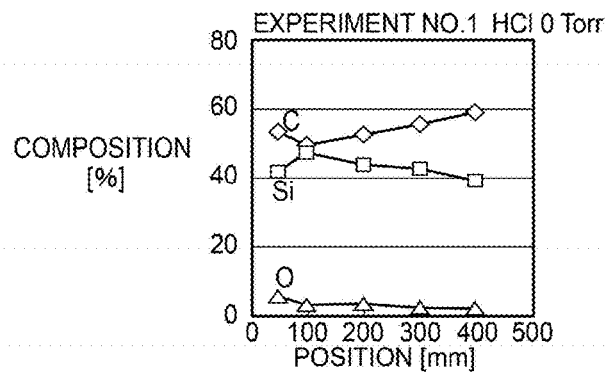
FIGS. 4A to 4D are graphs illustrating the relationship between the substrate position and composition.
Figure 4B:
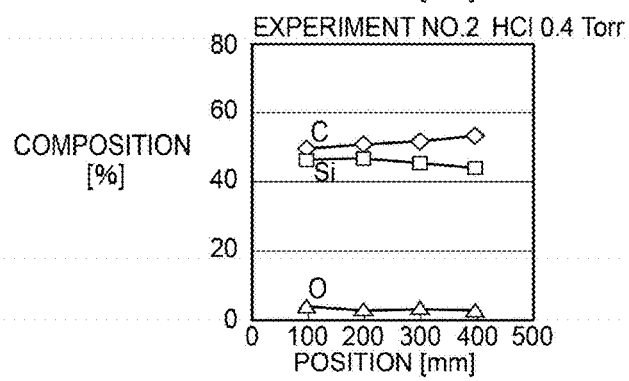
Figure 4C:
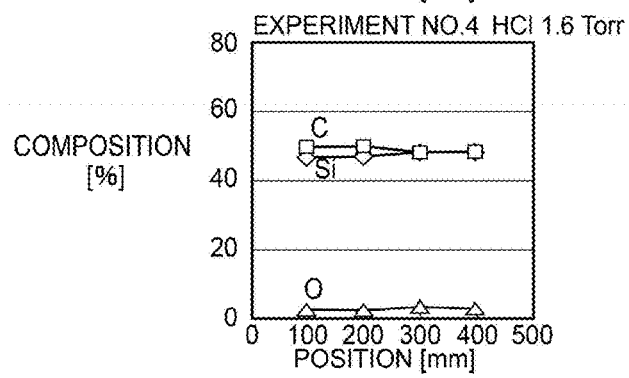
Figure 4D:
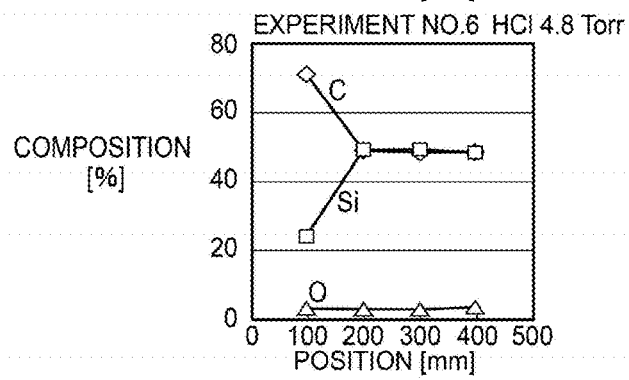

In the case where the precursor gas includes only TMS with no hydrogen chloride added like Experiment No. 1 illustrated in FIG. 4A, the formed film includes excess carbon. On the other hand, in the case where the precursor gas includes hydrogen chloride in addition to TMS like Experiments No. 2, 4, and 6 illustrated in FIGS. 4B to 4D, the formed film includes silicon carbide of the stoichiometric composition. However, when the concentration of added hydrogen chloride is excessively high like Experiment No. 6 illustrated in FIG. 4D, extremely high film formation inhibiting effect on the silicon precursor reduces the growth rate, and the amount of carbon becomes excessive. In order to set the growth rate in the desired range, hydrogen chloride needs to be added at a proper concentration. Specifically, it is desirable that the ratio $\alpha$ of TMS to HCl is $1 \leq \alpha \leq 3$.

Figure 6A:
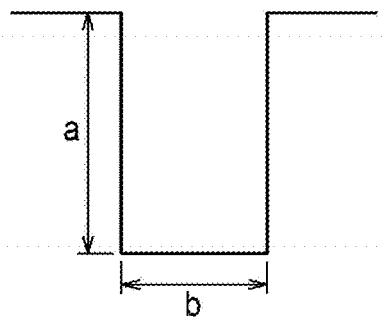
FIGS. 6A and 6B are explanatory diagrams illustrating definition of the aspect ratio and step coverage.
Figure 6B:
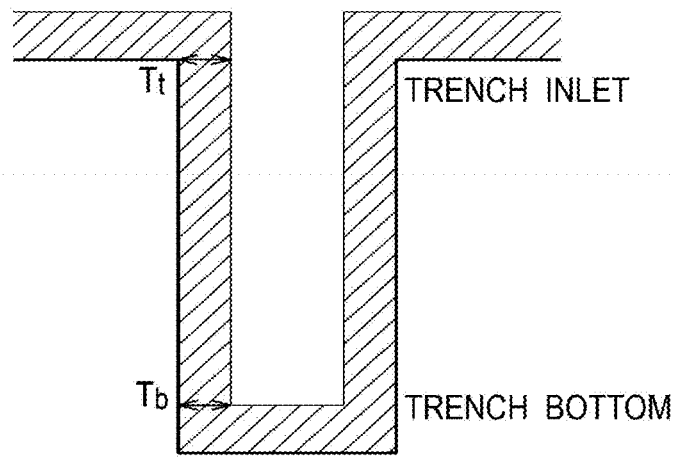
Figure 7A:
FIGS. 7A to 7D are photographs illustrating byproducts sticking to a reaction tube.
Figure 7B:
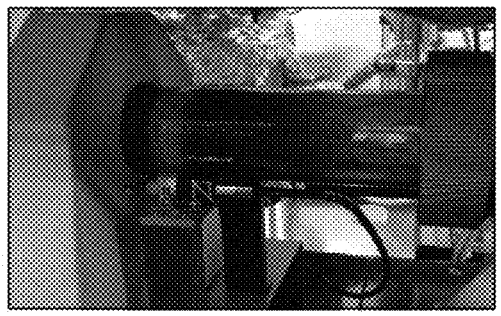
Figure 7C:
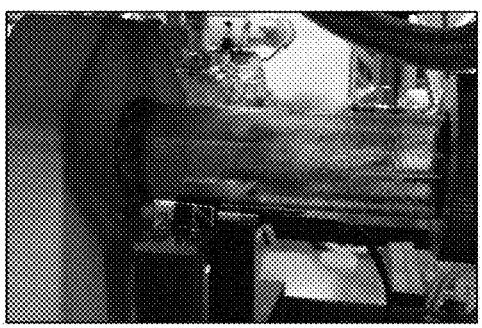
Figure 7D:
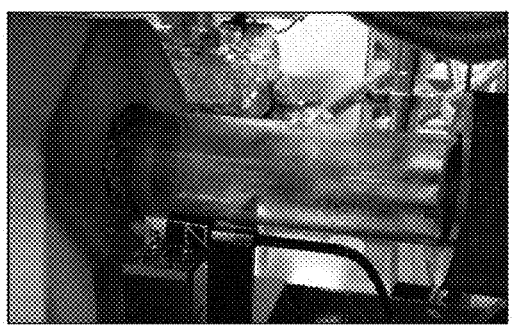

FIG. 5 is a graph illustrating the relationship between the substrate position and step coverage. FIGS. 6A and 6B are explanatory diagrams illustrating definition of the aspect ratio and step coverage. As illustrated in FIG. 6A, the aspect ratio is given by a ratio a/b of a depth a to a trench width b which are formed by the microstructures. The step coverage is given by a ratio $T_b/T_t$ of film thickness $T_b$ on the bottom of the trench to film thickness $T_t$ at the inlet of the trench.

Polygonal lines C1 to C5 of FIG. 5 illustrate the results of Experiments No. 1 to 5 when the concentration of added hydrogen chloride is set to 0, 0.4, 0.8, 1.6, and 4.8 Torr, respectively and the microstructures of the first to fifth substrates 101 to 105 have an aspect ratio of 35. As illustrated by the polygonal lines C1 to C5, there is a tendency of the step coverage increasing and being improved as the concentration of added hydrogen chloride increases independently of the positions of the first to fifth substrates 101 to 105. The improvement in step coverage means implementation of uniform film formation on the microstructures.

FIGS. 7A to 7D are photographs illustrating byproducts sticking to the reaction tube 11 of the electric furnace 10. The photographs in FIGS. 7A to 7D are taken near the end of the heater 12 on the downstream side like the first position P1 in FIG. 1 ten minutes after the gas mixture is introduced to the reaction tube 11 to start film formation.

In Experiment No. 1 with no hydrogen chloride added (FIG. 7A), a large amount of black dust is generated and sticks to the inside of the wall surface of the reaction tube 11. In Experiment No. 4 with the concentration of added hydrogen chloride set to 1.6 Torr (FIG. 7B), a lot of black dust is generated, but the reaction tube 11 starts to become transparent. In Experiment No. 5 with the concentration of added hydrogen chloride set to 3.2 Torr (FIG. 7C), black dust disappears, but liquid byproducts begins to stick to the surface wall of the reaction tube 11. In Experiment No. 6 with the concentration of added hydrogen chloride set to 4.8 Torr (FIG. 7D), liquid byproducts stick to the wall surface of the reaction tube 11 in a similar manner to Experiment No. 7 of the comparative example, in which MTS is used as the precursor gas. In order to prevent generation of dust and byproducts, therefore, hydrogen chloride needs to be added at a proper concentration. Specifically, it is desirable that the ratio $\alpha$ of TMS to HCl is $1<\alpha \leq 3$.

As described above, the precursor gas is a gas mixture including TMS as the precursor gas and hydrogen chloride as the additive gas in the embodiment. The mole ratio $\alpha$ of TMS to HCl is desirably $0 \leq \alpha \leq 4$ to control the rate of film formation of silicon carbide in a desired range and desirably $1<\alpha \leq 3$ to prevent generation of dust and byproducts (herein, the number of moles of tetramethylsilane is assumed to be 1). Accordingly, setting a in the range of $1<\alpha \leq 3$ that satisfies the above both ranges increases the rate of film formation of silicon carbide to enable quick film formation and reduces generation of byproducts, thus increasing the mass production.

The aforementioned embodiment and example of the embodiment show examples to which the present embodiment is applied, and the present embodiment is not limited thereto.

INDUSTRIAL APPLICABILITY

The present embodiment is applicable to production of heat-resistant composite materials, production of mechanical parts, high-temperature resistant semiconductors, and high voltage-resistant power devices that use the heat-resistant composite materials, and the like.

While embodiments have been exemplified with the help of the drawings, many modifications and changes are apparent to those skilled in the art.

What is claimed is:

1. A method of producing a heat-resistant composite material using chemical vapor deposition or chemical vapor infiltration, the method comprising:
    accommodating a base material in a reaction furnace; and
    causing precursor gas, additive gas, and carrier gas to flow in the reaction furnace to deposit silicon carbide on the base material for film formation,
    wherein
    the precursor gas comprises tetramethylsilane, and
    the additive gas comprises hydrogen chloride,
    wherein a mole ratio $\alpha$ of tetramethylsilane to hydrogen chloride satisfies $1<\alpha \leq 3$ where the number of moles of tetramethylsilane is 1.

2. The method of manufacturing a heat-resistant composite material according to claim 1, wherein
    the additive gas further comprises at least one selected from the group consisting of monochloromonomethylsilane, methyldichlorosilane, methyltrichlorosilane, dimethylmonochlorosilane, dimethyldichlorosilane, trimethylmonochlorosilane, monochlorosilane, dichlorosilane, trichlorosilane, tetrachloroethane, chlorodisilane, dichlorodisilane, hexachlorodisilane, octachlorotrisilane, monochloromethane, dichloromethane, chloroform, tetrachloromethane, monochloroacetylene, dichloroacetylene, monochloroethylene, dichloroethylene, trichloroethylene, tetrachloroethylene, monochloroethane, dichloroethane, trichloroethane, tetrachloroethane, pentachloroethane, hexachloroethane, monochloropropane, dichloropropane, trichloropropane, tetrachloropropane, pentachloropropane, hexachloropropane, heptachloropropane, octachloropropane, and chlorine molecules.

3. The method of manufacturing a heat-resistant composite material according to claim 2, wherein the additive gas comprises monochloromethane.

4. The method of manufacturing a heat-resistant composite material according to claim 1, wherein growth rate and filling uniformity at the film formation of silicon carbide are controlled through the amount of the additive gas.

5. The method of manufacturing a heat-resistant composite material according to claim 4, wherein the film formation of silicon carbide follows a first-order reaction, and the growth rate and filling uniformity at the film formation of silicon carbide are controlled by controlling probability of a growth species sticking to the base material through the amount of the additive gas.

6. The method of manufacturing a heat-resistant composite material according to claim 4, wherein the film formation of silicon carbide follows a Langmuir-Hinshelwood rate formula, and the growth rate and filling uniformity at the film formation of silicon carbide are controlled by adjusting the amount of the additive gas so that the film formation is performed in a zero-order reaction region of the Langmuir-Hinshelwood rate formula.

7. The method of manufacturing a heat-resistant composite material according to claim 4, wherein both increasing the growth rate and ensuring the filling uniformity at the film formation of silicon carbide are implemented.

8. The method of manufacturing a heat-resistant composite material according to claim 4, wherein the distribution of growth rate at the film formation of silicon carbide in terms of the position in the reaction furnace arranged side by side in the direction from upstream to downstream is controlled through the amount of hydrogen chloride as the additive gas.

9. The method of manufacturing a heat-resistant composite material according to claim 8, wherein the distribution of growth rate is optimized to be uniform through the amount of hydrogen chloride as the additive gas.

10. The method of manufacturing a heat-resistant composite material according to claim 8, wherein the precursor gas is supplied through a plurality of positions located across the reaction furnace from the upstream end to the downstream end.

11. The method of manufacturing a heat-resistant composite material according to claim 1, wherein the precursor gas comprises at least one selected from the group consisting of methyltrichlorosilane and dimethyldichlorosilane.

12. The method of manufacturing a heat-resistant composite material according to claim 1, wherein the carrier gas comprises at least one selected from the group consisting of hydrogen, nitrogen, helium, and argon.

13. The method of manufacturing a heat-resistant composite material according to claim 1, wherein the additive gas includes an effect of inhibiting film formation.

14. The method of manufacturing a heat-resistant composite material according to claim 1, wherein the base material comprises at least one selected from the group consisting of a fiber preform, a substrate provided with a trench, and a porous substrate.

15. The method of manufacturing a heat-resistant composite material according to claim 1, wherein the reaction furnace is a hot-wall furnace.

* * * * *